United States Patent
Kujirai

(10) Patent No.: US 7,923,773 B2
(45) Date of Patent: Apr. 12, 2011

(54) SEMICONDUCTOR DEVICE, MANUFACTURING METHOD THEREOF, AND DATA PROCESSING SYSTEM

(75) Inventor: Hiroshi Kujirai, Tokyo (JP)

(73) Assignee: Elpida Memory, Inc., Tokyo (JP)

(*) Notice: Subject to any disclaimer, the term of this patent is extended or adjusted under 35 U.S.C. 154(b) by 107 days.

(21) Appl. No.: 12/255,817

(22) Filed: Oct. 22, 2008

(65) Prior Publication Data

US 2009/0101971 A1    Apr. 23, 2009

(30) Foreign Application Priority Data

Oct. 23, 2007 (JP) ................. 2007-275691

(51) Int. Cl.
*H01L 29/78* (2006.01)
*H01L 21/3205* (2006.01)
(52) U.S. Cl. ........................ 257/330; 438/589
(58) Field of Classification Search .......... 257/330, 257/332, 622; 438/270, 589
See application file for complete search history.

(56) References Cited

U.S. PATENT DOCUMENTS
7,189,617 B2 * 3/2007 Slesazeck et al. ............ 438/259

FOREIGN PATENT DOCUMENTS
JP       08-274277      10/1996
* cited by examiner

*Primary Examiner* — Mark Prenty
(74) *Attorney, Agent, or Firm* — Young & Thompson

(57) ABSTRACT

A bottom of a gate trench has a first bottom relatively far from an STI and a second bottom relatively near from the STI. A portion, in an active region, configuring the second bottom of the gate trench configures a side-wall channel region, and has a thin-film SOI structure sandwiched between the gate electrode and the STI. On the other hand, a portion configuring the first bottom of the gate trench functions as a sub-channel region. A curvature radius of the second bottom is larger than a curvature radius of the first bottom. In an approximate center in a length direction of the gate trench, a bottom of a trench is approximately flat, and on the other hand, in ends of the length direction, a nearly whole bottom of the trench is curved.

14 Claims, 10 Drawing Sheets

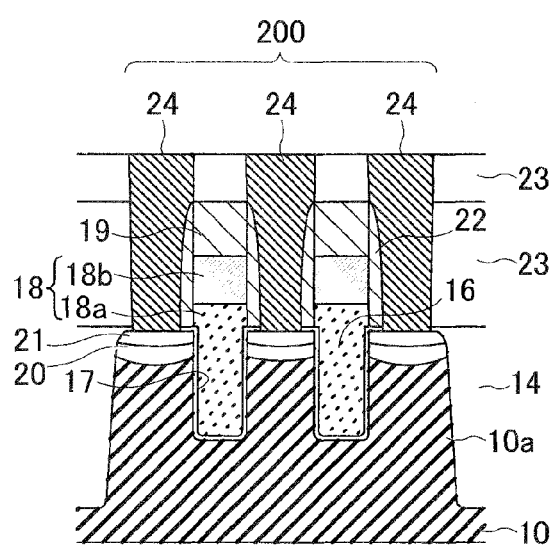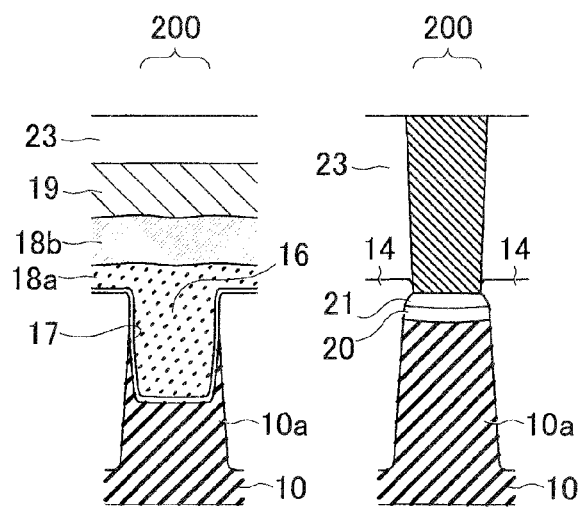
FIG.2A  FIG.2B  FIG.2C

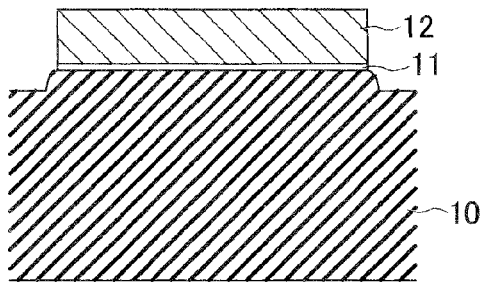
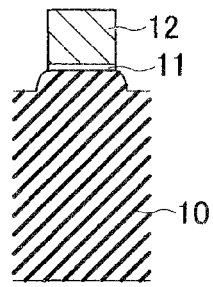
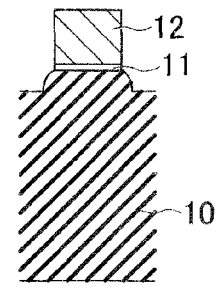
FIG.6A  FIG.6B  FIG.6C
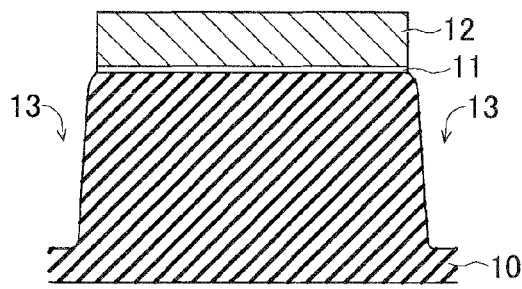
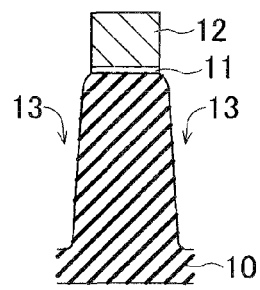
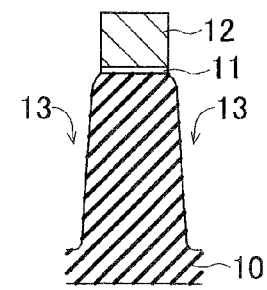
FIG.7A  FIG.7B  FIG.7C

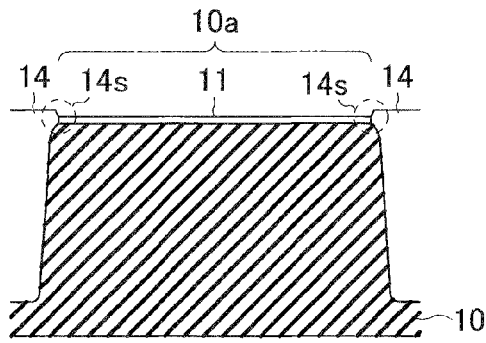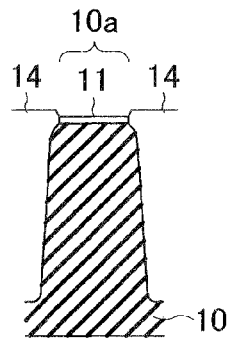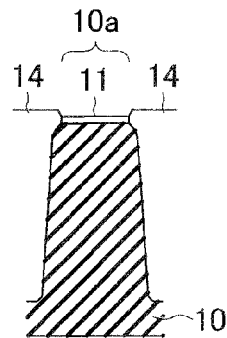
FIG.8A　　　　　　FIG.8B　　　FIG.8C
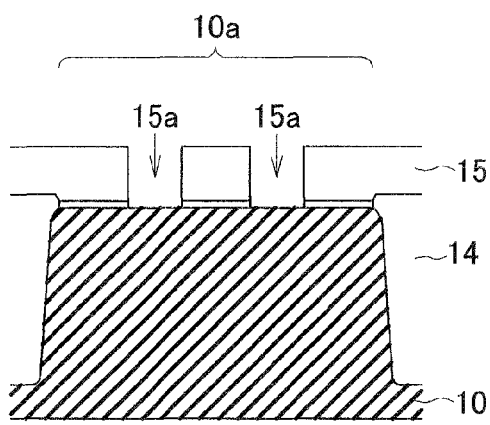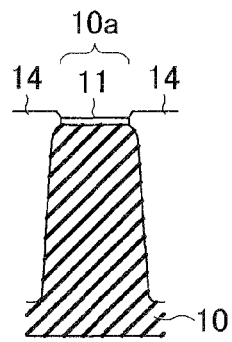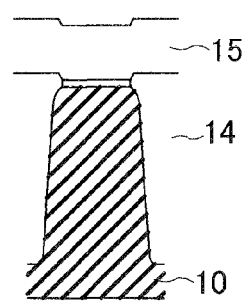
FIG.9A　　　　　　FIG.9B　　　FIG.9C

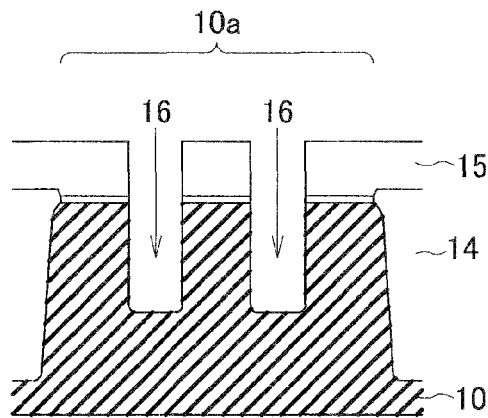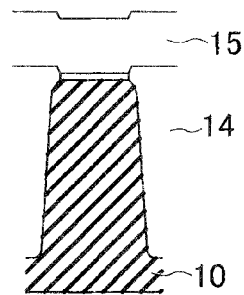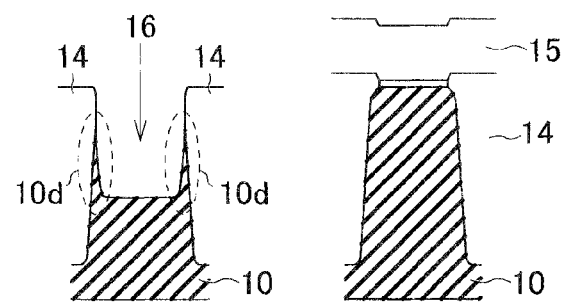
FIG.10A  FIG.10B  FIG.10C
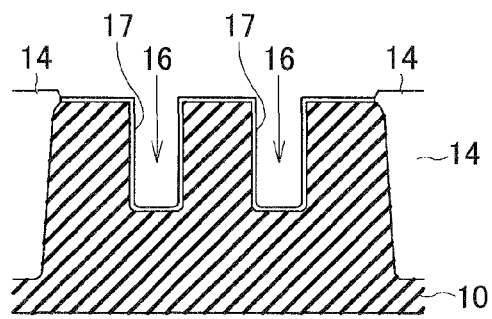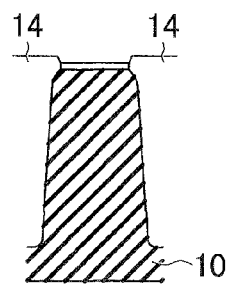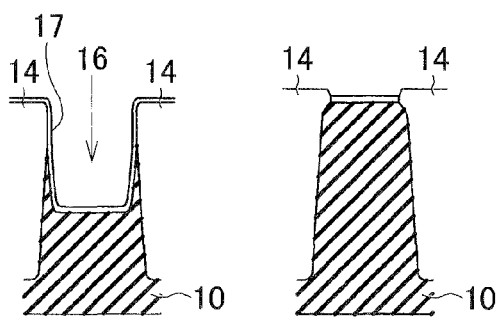
FIG.11A  FIG.11B  FIG.11C

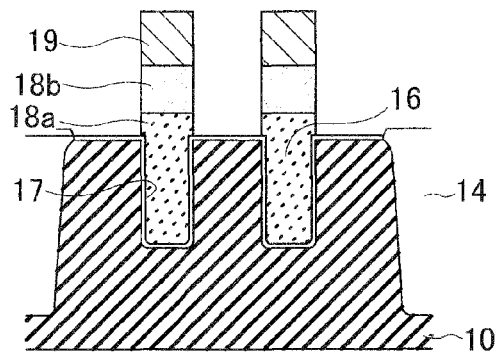 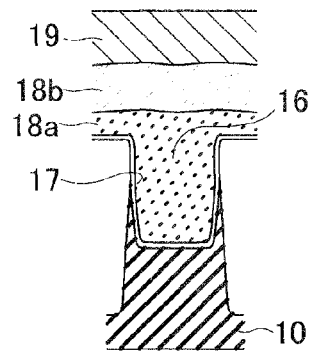 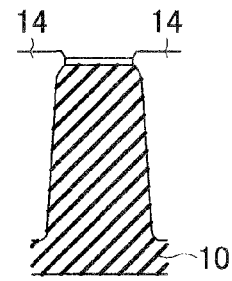
FIG.12A  FIG.12B  FIG.12C
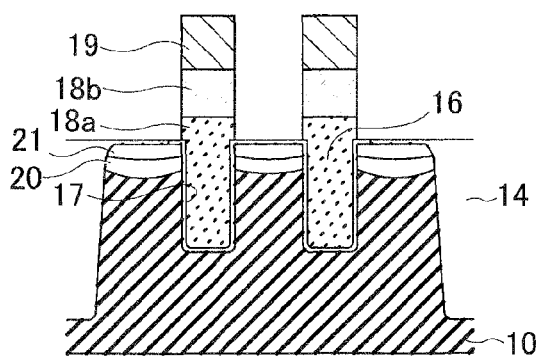 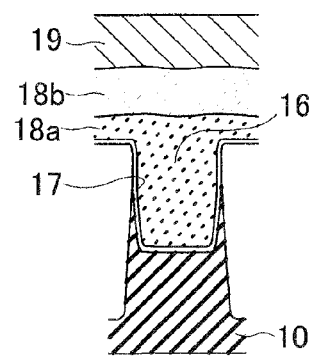 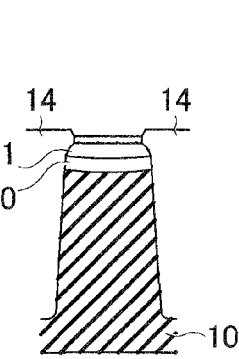
FIG.13A  FIG.13B  FIG.13C

SEMICONDUCTOR DEVICE, MANUFACTURING METHOD THEREOF, AND DATA PROCESSING SYSTEM

BACKGROUND OF THE INVENTION

1. Field of the Invention

The present invention relates to a semiconductor device and a manufacturing method thereof, and, more particularly relates to a semiconductor device including a trench-gate transistor and a manufacturing method thereof. The present invention also relates to a data processing system configured by such a semiconductor device.

2. Description of Related Art

In recent years, downscaling of high density and lower power DRAM (Dynamic Random Access Memory) requires a very short gate length of a cell transistor. The short gate length of the transistor leads to short channel effect degradation which results in high leakage current of a DRAM chip. Thus, the DRAM is confronted with the serious problem of this short channel effect.

To overcome this problem, attention is paid to a so-called trench-gate transistor (also called a "recess-channel transistor") so configured that a gate electrode is buried in a groove (trench) formed on a semiconductor substrate. By using the trench-gate transistor, an effective channel length can be sufficiently secured and a fine DRAM having a minimum machining dimension of 90 nm or less can also be realized. Further, there has recently been proposed a method in which a thin SOI (Silicon On Insulator) structure within a recess is formed, and the silicon layer is used as a channel region (Japanese Patent Application Laid-open No. H8-274277).

When the cell transistors shrink aggressively, there arises a need of narrowing the width of the gate trench. Thus, as shown in FIG. 15, a curvature radius at a corner on a bottom of a gate trench 16 becomes small, and thus a sub-threshold coefficient increases. This is probably due to the fact that a ratio of a channel-depletion-layer capacitance to a gate-oxide capacitance becomes greater at a location where the curvature radius is small. Compared to the larger curvature radius of the corner of the trench, the stand-by current of the smaller one increases. As a result, there is a problem that when the width of the gate trench is narrower, the refresh characteristic deteriorates.

SUMMARY

The present invention seeks to solve one or more of the above problems, or to improve upon those problems at least in part.

In one embodiment, a semiconductor device comprises: an active region having a source region and a drain region in which a gate trench is formed between the source region and the drain region; an element isolation region surrounding the active region; and a gate electrode of which at least one portion is buried in the gate trench, wherein the gate trench has a first bottom portion relatively far from the element isolation region and a second bottom portion relatively near from the element isolation region, and a curvature radius of the second bottom portion is larger than a curvature radius of the first bottom portion.

In this embodiment, it is preferable that a portion, in the active region, configuring the second bottom portion of the gate trench function as a main channel region, and the main channel region have a thin-film structure sandwiched between the gate electrode and the element isolation region.

On the other hand, it is preferable that a portion, in the active region, configuring the first bottom portion of the gate trench function as a sub-channel region. In this case, preferably, a threshold voltage of the main channel region is lower than a threshold voltage of the sub-channel region. Further, preferably, the second bottom of the gate trench has an inversely arched side-wall. Thereby, the side-wall channel region is an extremely thin SOI structure, and when a gate-to-source voltage $V_{GS}$ is low, a current is passed to the side-wall channel region only, and when $V_{GS}$ is high, the current is passed to both the trench bottom and the side-wall channel region. Thus, a cut-off characteristic can be favorable, and a sub-threshold characteristic can be improved.

In this embodiment, it is preferable that a side-wall surface of the element isolation region have an upper-portion-side-wall surface approximately vertical to a semiconductor substrate and a lower-portion-side-wall surface having a tapered shape. In this case, preferably, the main channel region is arranged between the gate electrode and the lower-portion-side-wall surface of the element isolation region. When the side-wall surface of the element isolation region is thus shaped, the inversely arched channel region of the thin-film SOI structure can be surely formed, and thus the height of the side-wall channel region can be kept low.

In this embodiment, it is preferable that the length of the gate trench within the active region is 40 to 70 nm, and the width of the gate trench is 80 to 90% of the length of the gate trench. When the length and the width of the gate trench have such a relationship, the inversely arched channel structure can be surely formed.

In another embodiment a manufacturing method of a semiconductor device comprises: forming an element isolation region on a semiconductor substrate so as to form a plurality of active regions separated one another by the element isolation region; forming a gate trench intersecting the active regions by etching the active regions so that a bottom of the gate trench has a first bottom portion relatively far from the element isolation region and a second bottom portion relatively near from the element isolation region and so that a curvature radius of the second bottom portion is larger than a curvature radius of the first bottom portion; forming a gate oxide film on an inner wall surface of the gate trench; and embedding a gate electrode inside the gate trench formed therein with the gate oxide film.

In this embodiment, it is preferable that in the step of forming the gate trench, a predetermined region within the active regions is etched so that a main channel region, in the active region, configuring the second bottom portion of the gate trench have a thin-film structure sandwiched between the gate electrode and the element isolation region.

According to the present invention, even in a fine transistor of which the gate width is equal to or less than 90 nm, for example, a curvature radius of the channel region can be made large. In this case, the effective channel length of the transistor becomes shorter than a groove gate. However, the channel region becomes an extremely thin SOI structure, and a cut-off characteristic becomes preferable. Thus, a threshold characteristic can be improved. As a result, a leakage current can be suppressed, and when the structure is applied to the memory cell transistor of the DRAM, a refresh characteristic can be enhanced.

BRIEF DESCRIPTION OF THE DRAWINGS

The above features and advantages of the present invention will be more apparent from the following description of certain preferred embodiments taken in conjunction with the accompanying drawings, in which:

FIGS. 2A to 2C are schematic diagrams each showing a structure of the cell transistor;

FIGS. 6A to 6C are schematic cross sections showing a manufacturing process of forming a mask pattern for the STI;

FIGS. 7A to 7C are schematic cross sections showing a manufacturing process of forming a trench for the STI;

FIGS. 8A to 8C are schematic cross sections showing a manufacturing process of forming the STI;

FIGS. 9A to 9C are schematic cross sections showing a manufacturing process of forming a mask pattern for a gate trench;

FIGS. 10A to 10C are schematic cross sections showing a manufacturing process of forming the gate trench;

FIGS. 11A to 11C are schematic cross sections showing a manufacturing process of forming a gate oxide film;

FIGS. 12A to 12C are schematic cross sections showing a manufacturing process of forming a gate electrode and a cap insulating film;

FIGS. 13A to 13C are schematic cross sections showing a manufacturing process of forming LDD regions and source/drain regions;

DETAILED DESCRIPTION OF THE PREFERRED EMBODIMENTS

Preferred embodiments of the present invention will now be explained in detail with reference to the drawings.

Figure 1:
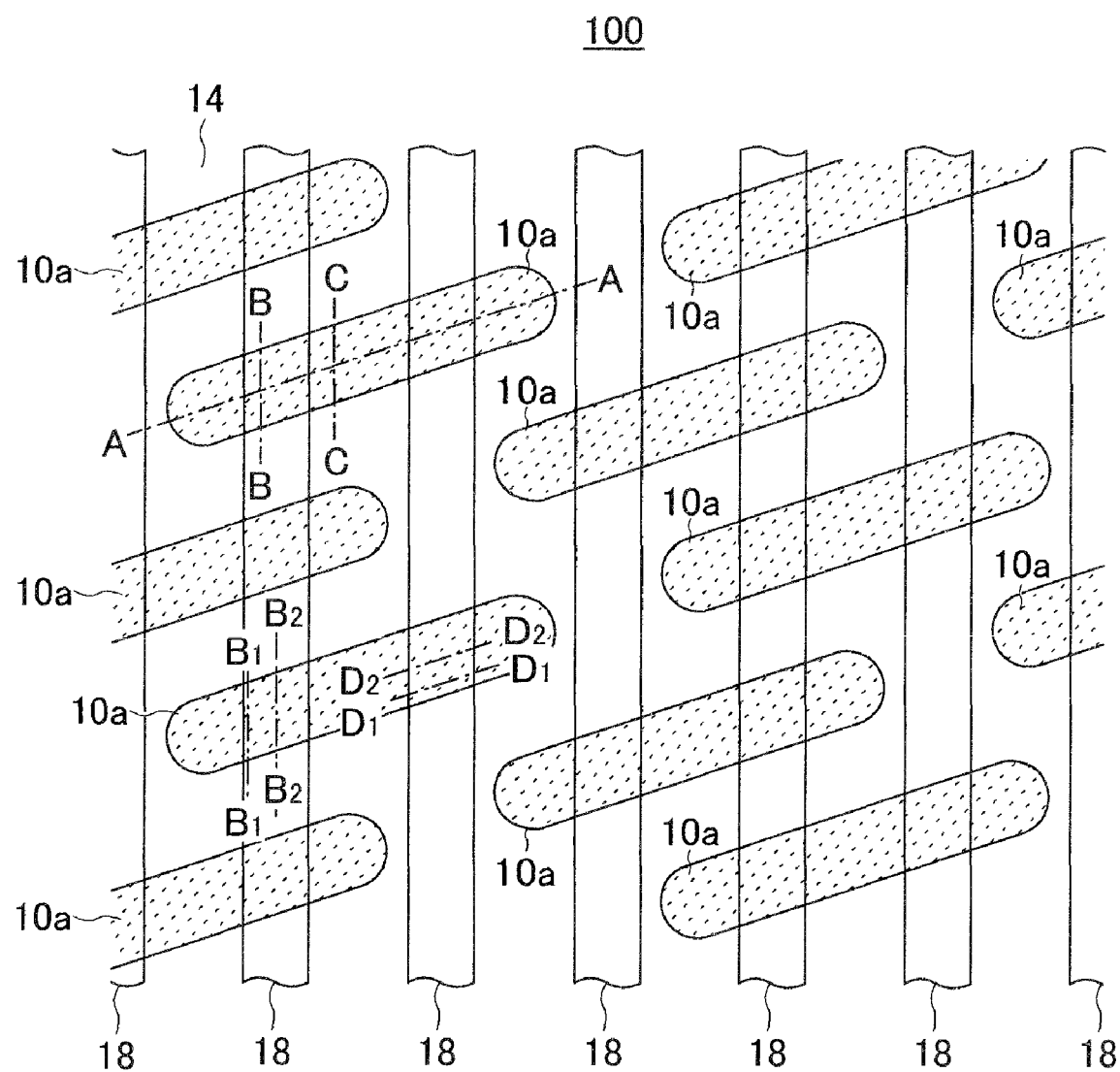
FIG. 1 is a schematic plan view showing a layout of a main part of a semiconductor device according to an embodiment of the present invention.

FIG. 1 is a schematic plan view showing a layout of a main part of a semiconductor device according to an embodiment of the present invention.

A semiconductor device 100 according to the present embodiment is a memory cell of a DRAM, and includes a plurality of active regions 10a formed therein with cell transistors and a plurality of gate electrodes 18 formed in one direction extending across the active regions 10a, as shown in FIG. 1. Although not shown in FIG. 1, the memory cell of the DRAM is formed of one cell transistor and one cell capacitor, and has a structure in which cell capacitors are stacked vertically one after another above the cell transistor formed within the active regions 10a. The active regions 10a have an elongated planar shape of which the periphery is surrounded by STI (Shallow Trench Isolation) 14, and a longitudinal direction of the active regions 10a forms a predetermined angle relative to an arranging direction of the gate electrodes 18. Each active region 10a is laid out to intersect the two gate electrodes 18.

FIGS. 2A, 2B, and 2C are schematic diagrams each showing a structure of the cell transistor. FIG. 2A shows a cross section along an A-A line of FIG. 1, FIG. 2B shows a cross section along a B-B line of FIG. 1, and FIG. 2C shows a cross section along a C-C line of FIG. 1.

As shown in FIGS. 2A, 2B, and 2C, a cell transistor 200 includes a gate trench 16 formed within the active region 10a, a gate oxide film 17 formed on an inner wall surface of the gate trench 16, a gate electrode 18 of which one portion is buried inside the gate trench 16, a cap insulating film 19 that protects a top surface of the gate electrode 18, a side-wall insulating film 22 that protects a side surface of the gate electrode 18, LDD (Lightly Doped Drain) regions 20 and source/drain regions 21 arranged at a center and on both ends in a longitudinal direction of the active region 10a, and a cell contact 24 arranged above each source/drain region 21.

Although not particularly limited in the present invention, the gate electrode 18 is formed of a DOPOS (Doped Polysilicon) film 18a and a conductive multilayer film 18b formed on the DOPOS film 18a. Preferably, the conductive multilayer film 18b has a structure in which a tungsten silicide (WSix) film, a tungsten nitrogen (WN) film formed on the WSix film, and a tungsten (W) film formed on the WN film are stacked in this order. A lower portion of the DOPOS film 18a is buried inside the gate trench 16, and an upper is portion thereof protrudes upwardly from a substrate surface. Preferably, the DOPOS film 18a has a thickness of about 100 nm, the WSix film about 10 nm, the WN film about 5 nm, and the W film about 70 nm, respectively.

Figure 3:
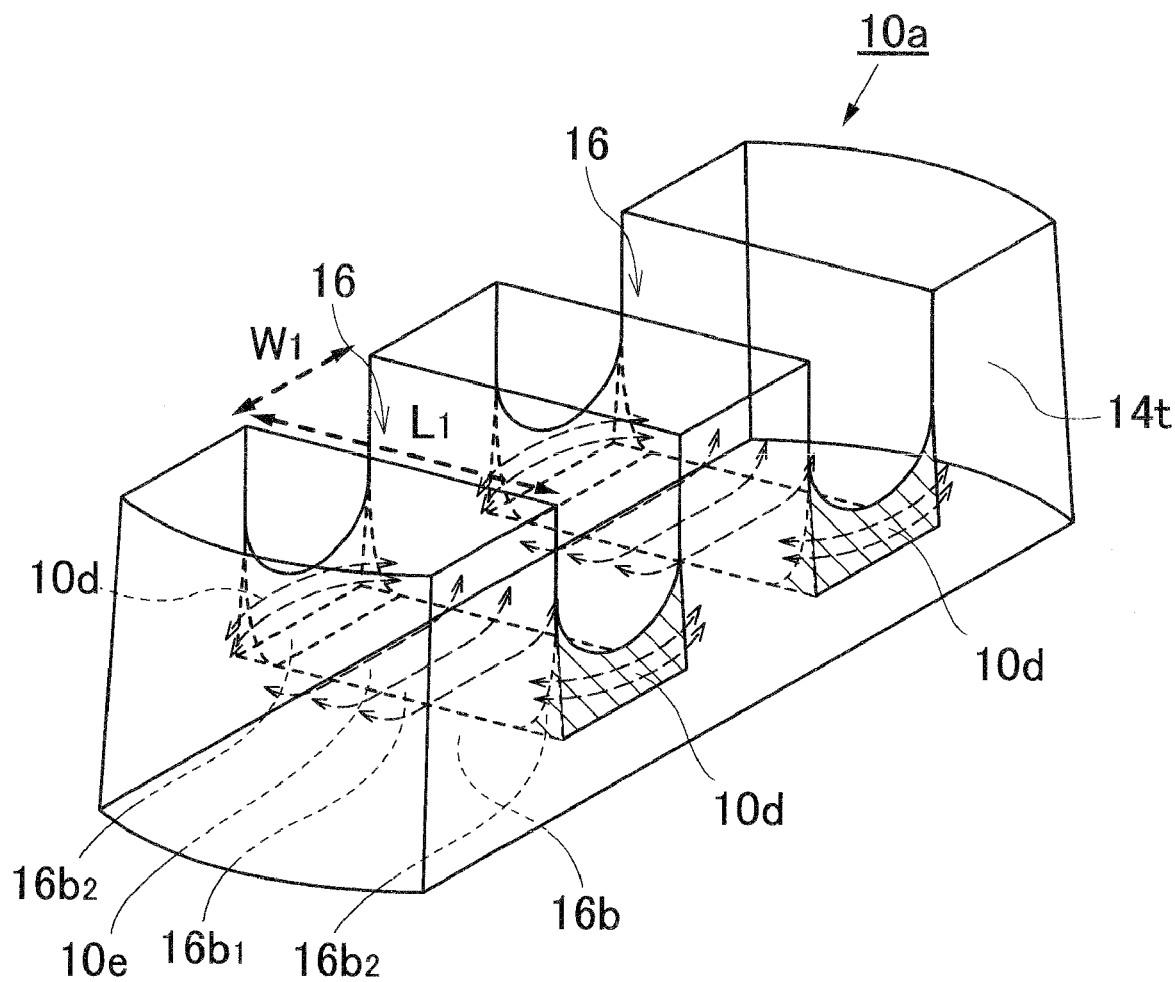
FIG. 3 is a schematic perspective view for explaining a structure of the active region shown in FIG. 1.
Figure 4A:
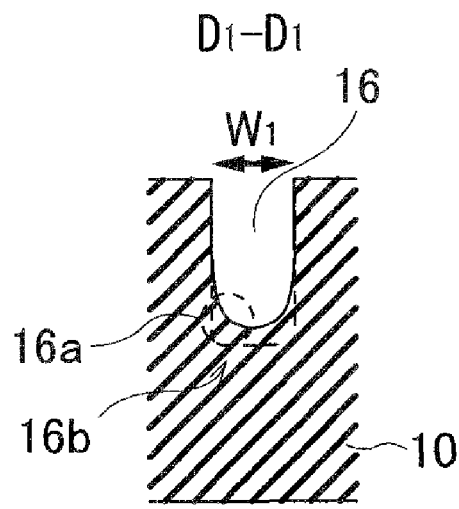
FIGS. 4A to 4D are schematic diagrams each showing a structure of the gate trench.
Figure 4B:
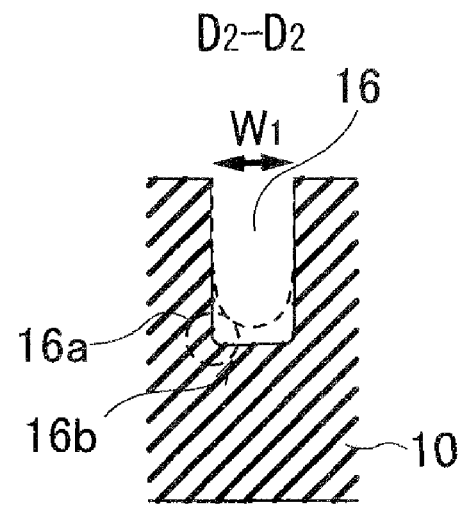
Figure 4C:
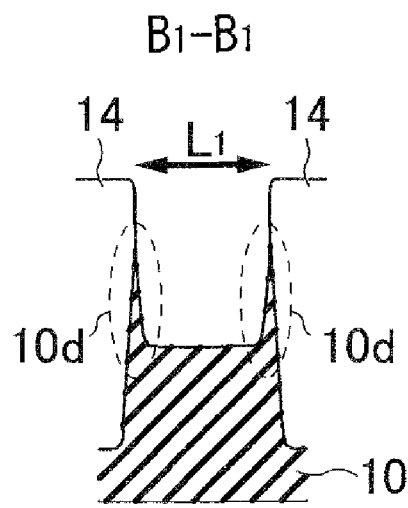
Figure 4D:
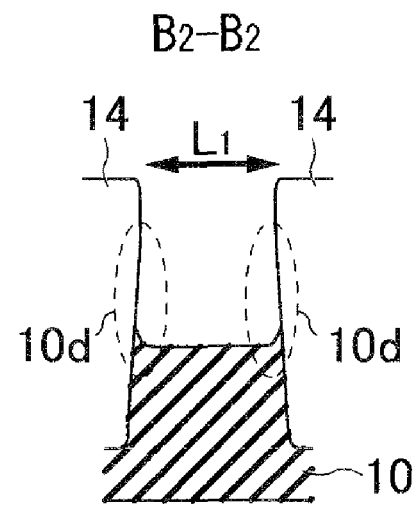

FIG. 3 is a schematic perspective view for explaining a structure of the active region 10a. FIGS. 4A, 4B, 4C, and 4D are schematic cross sections each showing a structure of the gate trench 16. FIG. 4A shows a cross section along a $D_1$-$D_1$ line of FIG. 1, FIG. 4B shows a cross section along a $D_2$-$D_2$ line of FIG. 1, FIG. 4C shows a cross section along a $B_1$-$B_1$ line of FIG. 1, and FIG. 4D shows a cross section along a $B_2$-$B_2$ line of FIG. 1.

As shown in FIG. 3, in one active region 10a, two gate trenches 16 and 16 are formed. Preferably, a length $L_1$ of the gate trench 16 within the active region 10a is longer than a width $W_1$ of the gate trench 16. More specifically, the length $L_1$ of the gate trench 16 is preferably 40 to 70 nm, and the width $W_1$ of the gate trench 16 is preferably 80 to 90% of the length $L_1$ of the gate trench 16. The reason for this is that when the width $W_1$ of the gate trench 16 is within the range, the problem to be solved by the present invention is remarkably generated, and when the length $L_1$ and the width $W_1$ of the gate trench 16 have the relationship, an inversely arched side-wall channel region, described later, is easily formed. The length $L_1$ of the gate trench 16 indicates a distance in a direction extending across the active region 10a. Accordingly, the length $L_1$ of the gate trench 16 substantially matches the width of the active region 10a.

In the active region 10a, a portion configuring a bottom 16b of the gate trench 16 functions as a channel region. According to such a 3-dimensional channel structure, even when the width $W_1$ of the gate trench 16 is narrow, a sufficiently effective channel length can be obtained. Thereby, high-density memory cells are realized, and at the same time, leakage current can be suppressed.

The bottom 16b of the gate trench 16 has an approximate center in a length direction of the gate trench 16, i.e., a first bottom $16b_1$ relatively apart from an element isolation region 14, and approximate ends in the length direction of the gate trench 16, i.e., second bottoms $16b_2$ relatively near from the element isolation region 14. Portions configuring the second bottoms $16b_2$ of the gate trench 16, in the active region 10a, configure side-wall channel regions 10d (main channel regions), and have a thin-film SOT structure sandwiched between the gate electrode 18 and the element isolation region 14. On the other hand, a portion configuring the first bottom $16b_1$ of the gate trench 16, in the active region 10a, functions as a sub-channel region 10e.

As shown in FIG. 3, a curvature radius of the second bottom $16b_2$ is larger than that of the first bottom corner $16b_1$. In the present embodiment, the first bottom corner $16b_1$ of the gate trench 16 has a flat surface approximately in parallel with the semiconductor substrate (see FIG. 4B), whereas the second bottom $16b_2$ of the gate trench 16, which is inversely arched, has substantially no flat surface (see FIG. 4A).

By such an inversely arched shape, a depth (recess amount) of the gate trench 16 becomes deepest at the center of a length direction ($L_1$ direction) of the gate trench 16, and the depth becomes gradually shallow as it approaches both ends, as shown in FIGS. 4A and 4B. Such a cross-sectional shape changes depending on a location of the longitudinal direction ($L_1$ direction) of the gate trench 16. As described above, when the active region 10a is cut near an approximate center in the longitudinal direction of the gate trench 16, the bottom surface of the trench is approximately flat, and thus a curvature radius of a corner 16a is small, as shown in FIG. 4B. That is, only the corner 16a is slightly curved to be inversely arched. In contrary thereto, when the active region 10a is cut at ends in the longitudinal direction of the gate trench 16, a nearly whole bottom surface of the trench is curved, and thus the curvature radius of the corner 16a is large, as shown in FIG. 4A.

As a result, as shown in FIGS. 4C and 4D, the gate trench 16 is so structured that on both sides in the longitudinal direction of the gate trench 16 within the active region 10a, silicon thin films 10d are left in an inversed arch. The side-wall channel regions of the thin-film SOI structure can be formed to be very thin, and thereby a complete depletion in this region can be achieved.

To surely form the thin-film SOI structure, as shown in FIGS. 4C and 4D, a side-wall surface of the STI 14 is preferably in an inversely tapered shaped (that is, the side-wall surface of the active region 10a is in a forward tapered shape). An angle of the side-wall surface of the STI 14 can be less than 90 degrees, and more preferably it is equal to or less than 88 degrees. However, when the angle is equal to or less than 80 degrees, the SOI structure becomes too thick, and thus not preferable. When the side-wall surface of the active region 10a has such a slant, the silicon side-wall 10d contacting the side-wall surface of the STI 14 can be surely left at a time of forming the gate trench 16 by gouging the active region 10a.

The SOI structure formed of the silicon thin film thus formed, together with the bottom 16b of the gate trench 16, functions as the channel region (main channel region). Accordingly, the SOI structure is so structured that when a gate-to-source voltage $V_{GS}$ of the cell transistor 200 exceeds a threshold voltage, a current is passed to the side-wall channel region 10d. Particularly, when $V_{GS}$ is low, the current is passed to the side-wall channel region 10d only, and when $V_{GS}$ is high, the current is passed to both the trench bottom 16b and the side-wall channel region 10d. When a recess-channel transistor has such a channel structure, an effective channel length of the transistor is shorter than a conventional simple recess channel transistor. However, the side-wall channel region 10d is an extremely thin SOI structure and a cut-off characteristic becomes favorable. Thus, a sub-threshold characteristic can be improved.

Further, the upper portion (the second bottom $16b_2$ of the gate trench 16) of the side-wall channel region 10d has an inversely arched shape, and thus controlling the threshold voltage $V_{th}$ is easy. Generally, to control $V_{th}$ of a depleted transistor, there is a need of changing a work function of a gate electrode (for example, changing from an N$^+$ gate to a P$^+$ gate), and thus a fine adjustment of $V_{th}$ is difficult. However, according to this structure, $V_{th}$ can be controlled only by an ion implantation of the channel region below the source/drain region while keeping the gate electrode as the N$^+$ gate.

Thus, in the semiconductor device, the curvature radius of the upper portion of the side-wall channel region 10d, i.e., the second bottom corner $16b_2$ of the gate trench 16, is larger than that in the center of the gate trench 16, and accordingly, the thin-film SOI structure formed of the inversely arched side-wall channel region 10d can be obtained. When the inversely arched side-wall channel region 10d is present, the effective channel length of the transistor is slightly shorter than a case that such a side-wall channel region 10d is not present. However, the inversely arched side-wall channel region 10d is an extremely thin SOI structure and the cut-off characteristic becomes favorable. Thus, the threshold characteristic can be improved. As a result, a leakage current can be suppressed, and thus a refresh characteristic of the memory cell transistor of the DRAM can be enhanced.

Figure 5:
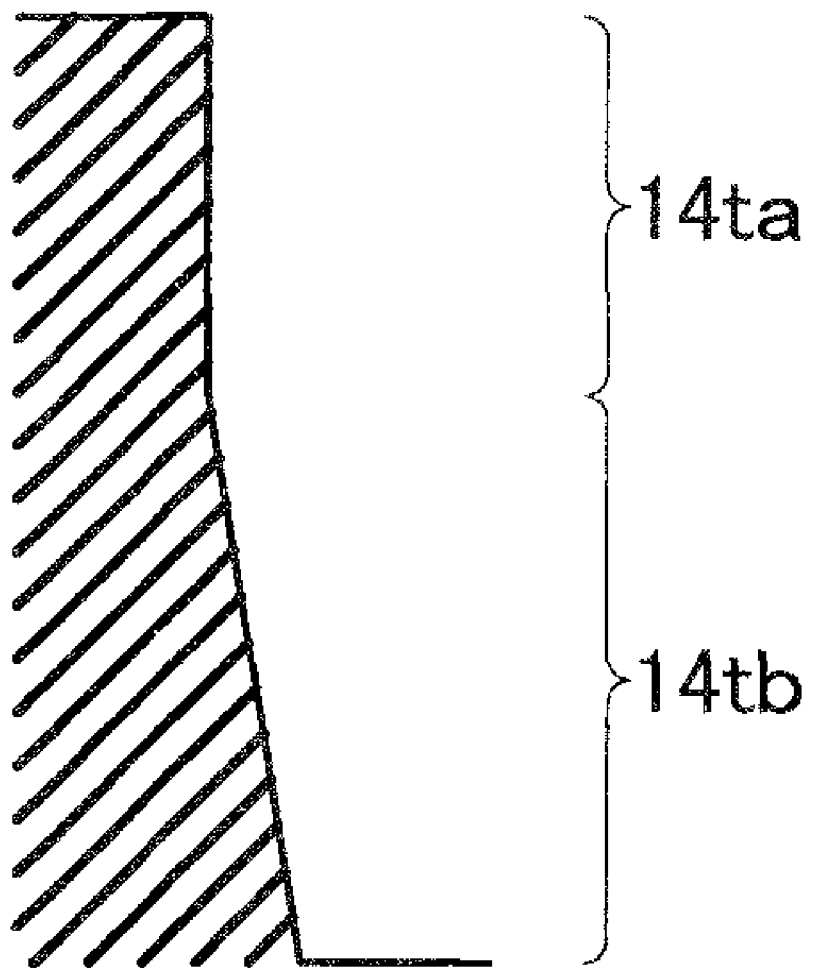
FIG. 5 is a schematic cross section showing another example of the shape of a STI.

FIG. 5 is a schematic cross section showing another example of the shape of the STI 14.

As shown in FIG. 5, the entire side-wall surface of the STI 14 is configured by an upper-portion-side-wall surface 14ta vertical to the substrate surface and a lower-portion-side-wall surface 14tb having an inversely tapered shape, rather than being configured by a tapered surface. Although not particularly limited, when a depth of the STI 14 is 200 nm, it is preferable that the height of the upper-portion-side-wall surface 14ta is 70 nm and the height of the lower-portion-side-wall surface 14tb is 130 nm. An angle of tapering can be less than 90 degrees, and it is preferably equal to or less than 88 degrees. When the STI 14 is thus shaped, silicon within the active region 10a contacting the upper-portion-side-wall surface is removed by etching at a time of forming the gate trench and only silicon contacting the lower-portion-side-wall surface 14tb is left. Thus, the height of the side-wall channel region can be kept low. When the side-wall channel region is thus shaped, a complete depletion of the channel is further facilitated, which can further improve the cut-off characteristic.

With reference to FIG. 6 to FIG. 13, a manufacturing method of the semiconductor device is described next in detail.

FIG. 6 to FIG. 13 are schematic cross sections each showing a manufacturing step of the semiconductor device 100. A portion "A" in each drawing corresponds to an A-A cross section in FIG. 1, a portion "B" corresponds to a B-B cross section, and a portion "C" corresponds to a C-C cross section, respectively.

In the manufacturing step of the semiconductor device, as shown in FIGS. 6A, 6B, and 6C, at first, a mask pattern for an STI is formed on the silicon substrate 10. When the mask pattern is formed, a pad oxide film 11 and a silicon nitride film 12 are sequentially formed on a surface of the silicon substrate 10. Although not particularly limited, it is preferable that the pad oxide film 11 have a film thickness of about 9 nm and the silicon nitride film 12 have a film thickness of about 120 nm. The pad oxide film 11 can be formed by thermal oxidization and the silicon nitride film 12 can be formed by an HDP-CVD (High Density Plasma-Chemical Vapor Deposition) method. Subsequently, by using known photolithography and etching techniques, the pad oxide film 11 and the silicon nitride film 12 are left in a region where the active region 10a shown in FIG. 1 is to be formed. At this time, the pad oxide film 11 is over-etched, and thus, also the surface of the silicon substrate 10 is slightly etched, as shown in the drawing.

Thereafter, as shown in FIGS. 7A, 7B, and 7C, the silicon nitride film 12 is used as a mask to dry-etch the silicon substrate 10, and thereby a trench for an STI 13, having a depth of about 200 nm, is formed on the silicon substrate 10. When an entire side-wall surface of the trench for an STI 13 has a constant tapered shape, an etching condition can be constant. As shown in FIG. 5, when the side-wall surface 13t of the trench for an STI 13 includes a vertical surface, the etching condition at a time of forming the trench can be switched in a middle of the etching. As a condition at a time of forming the vertical surface, a mixture gas including HBr, $O_2$, $SF_6$ or the like is used and the etching can be performed with a pressure of 10 mTorr and power of 200 W. As a condition at a time of forming the tapered surface, a mixture gas including $Cl_2$, $O_2$, $N_2$ or the like is used and the etching can be performed with a pressure of 10 mTorr and power of 100 W.

Next, as shown in FIGS. 8A to 8C, a silicon oxide film 14 is embedded inside the trench for an STI 13 to form the STI. In the formation of the STI, at first, a thin silicon oxide film (not shown), as an underlying film, is formed on an inner wall surface of the trench 13 by thermal oxidization at about 1000° C. Thereafter, on an entire substrate surface including an interior of the trench 13, the silicon oxide film (element isolation film) 14 having a thickness of about 400 to 500 nm is deposited by a CVD method.

Thereafter, the silicon nitride film 12 is used as a stopper to polish the silicon oxide film 14 by a CMP (Chemical Mechanical Polishing) method. Further, an upper portion of the silicon oxide film 14 is removed by wet etching by fluorinated acid, and the silicon nitride film 12 is then removed by wet etching by hot phosphoric acid at 160° C. At this time, as shown in FIG. 8A, an etching amount of the silicon oxide film 14 is so controlled that a top surface of the silicon oxide film 14 is located higher than that of the silicon substrate 10 and a shouldered portion 14s approximately vertical to the silicon substrate 10 is provided. Preferably, a step of the shouldered portion 14s is about 30 nm.

As described above, the STI formed of the silicon oxide film 14 and a plurality of active regions 10a are completed.

Next, as shown in FIGS. 9A, 9B, and 9C, a mask pattern for a gate trench is formed. In the formation of the mask pattern, a silicon nitride film 15, having a thickness of about 100 to 120 nm, which serves as a hard mask at a time of forming the gate trench 16 is formed on an entire substrate surface. This is followed by using a photoresist (not shown) to pattern the silicon nitride film 15 by dry etching so that an opening is formed on a region on which the gate trench 16 is to be formed. Thereby, the silicon nitride film 15 results in a mask layer including on the active region 10a an opening 15a corresponding to the width of the gate trench. Preferably, the dry etching of the silicon nitride film 15 is performed under a condition that anisotropic dry etching by a mixture gas containing $CF_4$, $CHF_3$ or the like is used, and an etching rate ratio to the silicon oxide films 11 and 14 is larger than eight.

As shown in FIGS. 10A, 10B, and 10C, the silicon nitride film 15 is then used as a mask and a gate trench 16 having a depth of about 120 to 140 nm is formed. In the formation of the gate trench 16, at first, a pad oxide film 11 is removed by dry etching. This dry etching is also called breakthrough etching. For etching gas, a mixture gas containing, for example, $CF_4$, $CHF_2$, and Ar can be used. The etching is then switched to dry etching having a high selection ratio to the silicon nitride film 15 and the silicon oxide film 14, and a silicon nitride film 17 is used as a mask to etch the silicon substrate 10. Preferably, the etching to form the gate trench is performed under a condition that anisotropic dry etching by a mixture gas containing $Cl_2$, HBr, and $O_2$ is used and an etching rate ratio to the silicon oxide film 14 is larger than 15, for example.

The dry etching to form the gate trench 16 has a high selection ratio not only to the silicon nitride film 15 but also to the silicon oxide film 14, which is a material of the STI. Thus, as shown in FIG. 10B, the shouldered portion 14s of the silicon oxide film 14 functions as a mask, and on both sides of the gate trench 16, one portion of the silicon substrate 10 is not etched to be left thinly. The height of the silicon thin film 10d that is left thinly is about 25 to 55 nm.

As shown in FIGS. 11A, 11B, and 11C, on an inner wall surface of the gate trench 16, a gate oxide film 17 is formed next. In the formation of the gate oxide film 17, at first, a sacrificial oxide film (not shown) having a thickness of about 10 nm is formed on an inner wall surface of the gate trench 16. By wet etching using hot phosphoric acid, the silicon nitride film 15 is then removed, and by further wet etching using fluorinated acid, the sacrificial oxide film is removed. In this way, in a step after the formation of the gate trench, a damage incurred on the inner wall surface of the gate trench, together with the sacrificial oxide film, is removed, and thus an undamaged clean inner wall surface is reproduced. Thereafter, on the inner wall surface of the gate trench 16, a gate oxide film 17 having a thickness of about 8 nm is formed by thermal oxidization. Thus, the gate oxide film 17 is completed.

As shown in FIGS. 12A, 12B, and 12C, a gate electrode 18 and a cap insulating film 19 are formed. More specifically, at first, on an entire substrate surface including an interior of the gate trench 16, a DOPOS film 18a having a thickness of about 100 nm is deposited, and on top thereof, as a conductive multilayer film 18b, a tungsten silicide (WSix) film having a thickness of about 10 nm, a tungsten nitride (WN) film having a thickness of about 5 nm, a tungsten (W) film having a thickness of about 70 nm, and the silicon nitride film 19 having a thickness of about 140 nm are formed in this order. This is followed by linearly patterning of this multilayer film along the gate trench 16. As a result, a trench gate of a memory cell transistor having a portion buried inside the gate trench 16 and a portion protruded from a surface of the silicon substrate 10 is completed.

As shown in FIGS. 13A, 13B, and 13C, the gate electrode 18 and the cap insulating film 19 are then used as a mask and an ion implantation is performed. Thereby, LDD (Lightly Doped Drain) regions 20 and source/drain regions 21 are formed in a center and on both ends in a longitudinal direction of the active region 10a. In a case of an N channel MOS transistor, an N impurity such as P and As, and in a case of a P channel MOS transistor, a P impurity such as B, $BF_2$, and In are respectively ion-implanted under a predetermined condition.

On a side surface of the gate electrode 18, a side-wall insulating film 22 having a thickness of about 25 nm is formed. Thereafter, an interlayer insulating film 23 formed of a silicon oxide film is formed, and above the source/drain region 21, a cell contact 24 is formed. Thus, a recess-channel cell transistor 200 shown in FIGS. 2A, 2B, and 2C is completed.

Although illustrations for subsequent steps are omitted, a cell capacitor, a wiring or the like are formed according to an ordinary method, and the memory cell of the DRAM is thus completed.

As described above, according to the manufacturing method of the present embodiment, a channel region of an extremely thin SOI structure can be formed within the gate trench, and thus a threshold characteristic of a recess-channel transistor can be improved.

Figure 14:
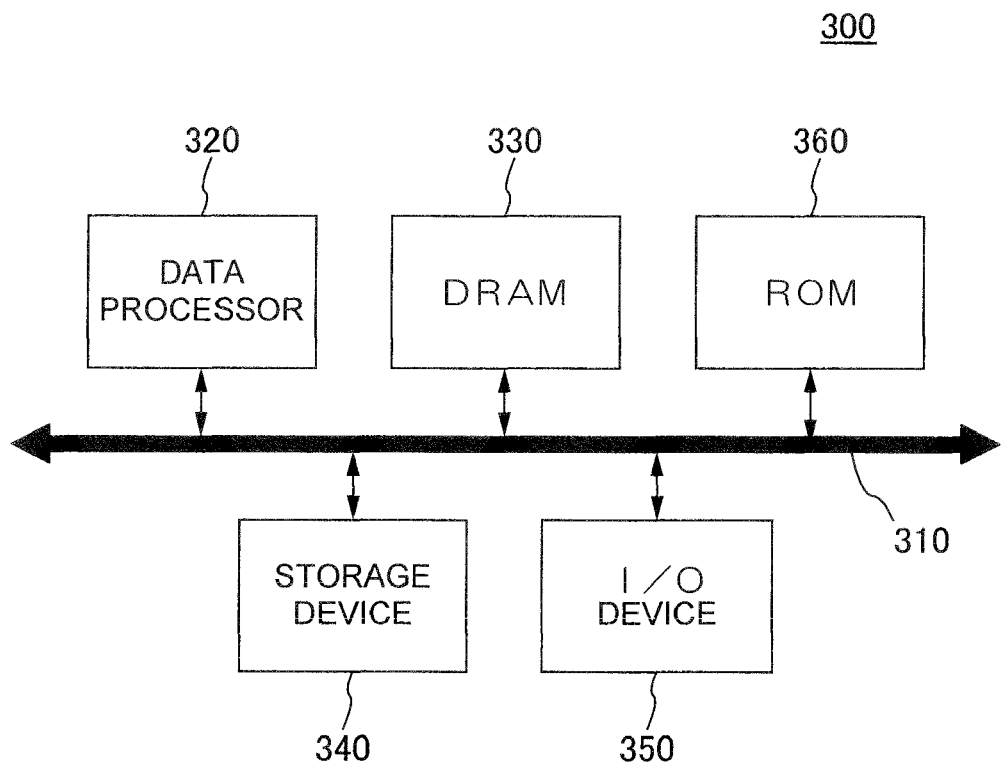
FIG. 14 is a block diagram showing a configuration of a data processing system using the semiconductor device and shows a case that the semiconductor device is a DRAM.
Figure 15:
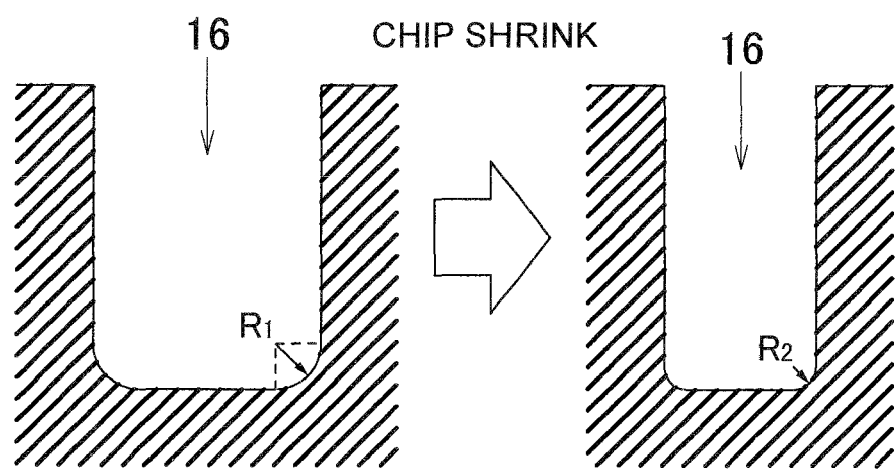
FIG. 15 is schematic cross section for explaining a curvature radius at a corner on a bottom of a gate trench.

FIG. 14 is a block diagram showing a configuration of a data processing system 300 using the semiconductor device and shows a case that the semiconductor device is a DRAM.

The data processing system 300 shown in FIG. 14 has a configuration such that a data processor 320 and a semiconductor device (DRAM) 330 according to the present embodiment are mutually connected via a system bus 310. Examples of the data processor 320 include, but are not limited to, a microprocessor (MPU) and a digital signal processor (DSP). In FIG. 14, for the sake of simplification, the data processor 320 and the DRAM 330 are connected via the system bus 310. However, these components can be connected by a local bus rather than being connected via the system bus 310.

In FIG. 14, for the sake of simplification, only one set of system bus 310 is shown. However, the system buses 310 can be arranged via a connector or the like in series or in parallel according to need. In the memory-system data processing system shown in FIG. 14, while a storage device 340, an I/O device 350, and a ROM 360 are connected to the system bus 310, these are not necessarily essential constituent elements.

Examples of the storage device 340 include a hard disk drive, an optical disk drive, and a flash memory. Examples of the I/O device 350 include a display device such as a liquid crystal display, and an input device such as a keyboard and a mouse. Regarding the I/O device 350, it is only necessary to provide either one of the input device or the output device. Further, for the sake of simplicity, each constituent element shown in FIG. 14 is shown one each. However, the number is not limited to one, and a plurality of one or two or more constituent elements can be provided.

The present invention is in no way limited to the aforementioned embodiments, but rather various modifications are possible within the scope of the invention as recited in the claims, and naturally these modifications are included within the scope of the invention.

For example, in the present embodiment, an example in which the present invention is applied to the cell transistor of the DRAM is described. However, applications of the present invention are not limited thereto, and the present invention can be applied to another transistor. Further, while the silicon substrate is used as the semiconductor substrate in the embodiment, the present invention is not limited to the silicon substrate, and other semiconductor materials can be used.

What is claimed is:

1. A semiconductor device, comprising:
   an active region having a source region and a drain region in which a gate trench is formed between the source region and the drain region;
   an element isolation region surrounding the active region; and
   a gate electrode of which at least one portion is buried in the gate trench,
   wherein the gate trench has a first bottom portion relatively far from the element isolation region and a second bottom portion relatively near from the element isolation region, and a curvature radius of the second bottom portion is larger than a curvature radius of the first bottom portion, and
   wherein the active region includes a main channel region that is positioned at the second bottom portion of the gate trench, the main channel region has a thin-film structure sandwiched between the gate electrode and the element isolation region.

2. The semiconductor device as claimed in claim 1, wherein the active region further includes a sub-channel region that is positioned at the first bottom portion of the gate trench.

3. The semiconductor device as claimed in claim 2, wherein the main channel region has a lower threshold voltage than that of the sub-channel region.

4. A semiconductor device, comprising:
   an active region having a source region and a drain region in which a gate trench is formed between the source region and the drain region;
   an element isolation region surrounding the active region; and
   a gate electrode of which at least one portion is buried in the gate trench,
   wherein the gate trench has a first bottom portion relatively far from the element isolation region and a second bottom portion relatively near from the element isolation region, and a curvature radius of the second bottom portion is larger than a curvature radius of the first bottom portion, and
   wherein the second bottom portion of the gate trench has an inversely arched side-wall.

5. The semiconductor device as claimed in claim 1, wherein the element isolation region has a side-wall surface including an upper-portion-side-wall surface approximately vertical to a semiconductor substrate and a lower-portion-side-wall surface having a tapered shape.

6. The semiconductor device as claimed in claim 5, wherein the main channel region is positioned between the gate electrode and the lower-portion-side-wall surface of the element isolation region.

7. A semiconductor device, comprising:
   an active region having a source region and a drain region in which a gate trench is formed between the source region and the drain region;
   an element isolation region surrounding the active region; and
   a gate electrode of which at least one portion is buried in the gate trench,
   wherein the gate trench has a first bottom portion relatively far from the element isolation region and a second bottom portion relatively near from the element isolation region, and a curvature radius of the second bottom portion is larger than a curvature radius of the first bottom portion, and
   wherein a length of the gate trench within the active region is 40 to 70 nm, and a width of the gate trench is 80 to 90% of the length of the gate trench.

8. A manufacturing method of a semiconductor device comprising:
   forming an element isolation region on a semiconductor substrate so as to form a plurality of active regions separated one another by the element isolation region;
   forming a gate trench intersecting the active regions by etching the active regions so that a bottom of the gate trench has a first bottom portion relatively far from the element isolation region and a second bottom portion relatively near from the element isolation region and so that a curvature radius of the second bottom portion is larger than a curvature radius of the first bottom portion;
   forming a gate oxide film on an inner wall surface of the gate trench; and embedding a gate electrode inside the gate trench formed therein with the gate oxide film.

9. The manufacturing method of a semiconductor device as claimed in claim 8, wherein the step of forming the gate trench is performed by etching the active regions so that a main channel region positioned at the second bottom portion of the gate trench is formed, the main channel region having a thin-film structure sandwiched between the gate electrode and the element isolation region.

10. A data processing system having a memory device, a data processor, and a system bus connecting the memory device and the data processor, the memory device comprising:
- an active region having a source region and a drain region in which a gate trench is formed between the source region and the drain region;
- an element isolation region surrounding the active region; and
- a gate electrode of which at least one portion is buried in the gate trench,
- wherein the gate trench has a first bottom portion relatively far from the element isolation region and a second bottom portion relatively near from the element isolation region, and a curvature radius of the second bottom portion is larger than a curvature radius of the first bottom portion, and
- wherein the active region includes a main channel region that is positioned at the second bottom portion of the gate trench, the main channel region has a thin-film structure sandwiched between the gate electrode and the element isolation region.

11. The semiconductor device as claimed in claim 1, wherein the second bottom portion of the gate trench has an inversely arched side-wall.

12. The semiconductor device as claimed in claim 1, wherein a length of the gate trench within the active region is 40 to 70 nm, and a width of the gate trench is 80 to 90% of the length of the gate trench.

13. A semiconductor device, comprising:
- an active region having a source region and a drain region in which a gate trench is formed between the source region and the drain region;
- an element isolation region surrounding the active region; and
- a gate electrode of which at least one portion is buried in the gate trench,
- wherein the gate trench has a first bottom portion relatively far from the element isolation region and a second bottom portion relatively near to the element isolation region, and
- wherein a curvature radius of the second bottom portion is larger than a curvature radius of the first bottom portion.

14. A data processing system having a memory device, a data processor, and a system bus connecting the memory device and the data processor, the memory device comprising:
- an active region having a source region and a drain region in which a gate trench is formed between the source region and the drain region;
- an element isolation region surrounding the active region; and
- a gate electrode of which at least one portion is buried in the gate trench,
- wherein the gate trench has a first bottom portion relatively far from the element isolation region and a second bottom portion relatively near from the element isolation region, and
- wherein a curvature radius of the second bottom portion is larger than a curvature radius of the first bottom portion.

* * * * *